(12) United States Patent
Guo et al.

(10) Patent No.: US 8,890,084 B1
(45) Date of Patent: Nov. 18, 2014

(54) METHOD FOR ANALYZING CIRCUIT PATTERN

(71) Applicant: United Microelectronics Corp., Hsin-Chu (TW)

(72) Inventors: Bin Guo, Singapore (SG); Xu Ma, Singapore (SG); Hong Liao, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/016,243

(22) Filed: Sep. 3, 2013

(51) Int. Cl.
*G01J 1/42* (2006.01)
*G01N 23/00* (2006.01)

(52) U.S. Cl.
CPC .................................... *G01N 23/00* (2013.01)
USPC ........................................................ 250/394

(58) Field of Classification Search
CPC ......... H01L 22/34; H01L 22/20; G06T 7/004; G06F 17/5081; G06F 17/5068
USPC ........................................................ 250/395
See application file for complete search history.

(56) References Cited

U.S. PATENT DOCUMENTS

| | | | |
|---|---|---|---|
| 5,128,737 A * | 7/1992 | van der Have | 257/503 |
| 5,666,049 A * | 9/1997 | Yamada et al. | 324/762.01 |
| 6,566,654 B1 * | 5/2003 | Funatsu et al. | 850/9 |
| 6,876,445 B2 * | 4/2005 | Shibuya et al. | 356/237.2 |
| 7,084,968 B2 * | 8/2006 | Shibuya et al. | 356/237.2 |
| 7,395,518 B2 * | 7/2008 | Ciplickas et al. | 324/763.01 |
| 7,576,910 B2 * | 8/2009 | Terada et al. | 359/383 |
| 7,802,218 B2 * | 9/2010 | Inoue et al. | 716/111 |
| 8,027,527 B2 * | 9/2011 | Shibuya et al. | 382/141 |
| 8,086,422 B2 * | 12/2011 | Shibuya et al. | 702/183 |
| 2005/0086617 A1 * | 4/2005 | Ciplickas et al. | 716/4 |
| 2005/0168731 A1 * | 8/2005 | Shibuya et al. | 356/237.4 |
| 2007/0101307 A1 * | 5/2007 | Ueda | 716/10 |
| 2011/0074817 A1 * | 3/2011 | Shinoda et al. | 345/634 |
| 2012/0114221 A1 * | 5/2012 | Satou et al. | 382/149 |
| 2013/0283227 A1 * | 10/2013 | Sakai et al. | 716/136 |

* cited by examiner

*Primary Examiner* — Kiho Kim
(74) *Attorney, Agent, or Firm* — Winston Hsu; Scott Margo

(57) ABSTRACT

A method for analyzing circuit pattern is disclosed. The method includes the steps of: providing a plurality of monitor metal line structures formed on discrete locations of a substrate corresponding to different values of variable factors; performing a defect review to identify failure locations of the monitor metal line structures; determining a failure tendency of the monitor metal line structures so as to determine a boundary of the variable factors; and determining whether adjustment is to be made to product metal line structures.

5 Claims, 2 Drawing Sheets

| Metal Line Patten Monitor Structure Design | | | |
|---|---|---|---|
| Variable 1 (V1) | Width(V1:W)/Spacing(V1:S) (Unit: nm) | 100/100 (90/90, 80/80, 70/70) | |
| Variable 2 (V2) | Length (Unit: μm) | 1-100 | |
| Variable 3 (V3) | Via Height (Unit: Å) | 750-1500 | |
| Variable 4 | Via Pattern | No Via | ISO Via | Dense Via |
| Final Pattern | Top View | | | |
| | Cross Section | | | |

FIG. 2

METHOD FOR ANALYZING CIRCUIT PATTERN

BACKGROUND OF THE INVENTION

1. Field of the Invention

The invention relates to a method for analyzing circuit pattern, and more particularly to a method for monitoring process window of circuit patterns.

2. Description of the Prior Art

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Another important part of manufacturing yield control is determining the cause of defects on wafers such that the cause of the defects can be corrected to thereby reduce the number of defects on other wafers. Often, determining the cause of defects involves identifying the defect type and other attributes of the defects such as size, shape, composition, etc. Since inspection typically only involves detecting defects on wafers and providing limited information about the defects such as location on the wafers, number of defects on the wafers, and sometimes defect size, defect review is often used to determine more information about individual defects than that which can be determined from inspection results. For instance, a defect review tool may be used to revisit defects detected on a wafer and to examine the defects further in some manner either automatically or manually.

Defect review typically involves generating additional information about defects at a higher resolution using either a high magnification optical system or a scanning electron microscope (SEM). The higher resolution data for the defects generated by defect review is more suitable for determining attributes of the defects such as profile, roughness, more accurate size information, etc. Defect analysis may also be performed using a system such as an electron dispersive x-ray spectroscopy (EDS) system. Such defect analysis may be performed to determine information such as composition of the defects. Attributes of the defects determined by inspection, review, analysis, or some combination thereof can be used to identify the type of the defect (i.e., defect classification) and possibly a root cause of the defects. This information can then be used to monitor and alter one or more parameters of one or more semiconductor fabrication processes to reduce or eliminate the defects.

As design rules shrink, however, semiconductor manufacturing processes may be operating closer to the limitations on the performance capability of the processes. For example, metal line pattern deforms has been found due to residual stress in TiN metal hard mask as interconnect metal and via critical dimensions shrunk with advanced technology node. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive. As such, determining which of the defects actually have an effect on the electrical parameters of the devices and the yield may allow process control methods to be focused on those defects while largely ignoring others. Furthermore, at smaller design rules, process induced failures may, in some cases, tend to be systematic. That is, process induced failures tend to fail at predetermined design patterns often repeated many times within the design. Elimination of spatially systematic, electrically relevant defects is important because eliminating such defects can have a significant overall impact on yield.

Accordingly, it may be advantageous to develop systems and methods for detecting design and process defects on a wafer and/or reviewing defects on a wafer such that defects from various sources can be detected, reviewed, and analyzed using a single system or method and to develop systems and methods for selecting one or more features within a design for use as process monitoring features that provide an earlier indication of a process deviation than currently used process monitoring features.

SUMMARY OF THE INVENTION

According to a preferred embodiment of the present invention, a method for analyzing circuit pattern includes the steps of: providing a plurality of monitor metal line structures formed on discrete locations of a substrate corresponding to different values of variable factors; performing a defect review to identify failure locations of the monitor metal line structures; determining a failure tendency of the monitor metal line structures so as to determine a boundary of the variable factors; and determining whether adjustment is to be made to product metal line structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a table illustrating variable factors and corresponding values that could be obtained from monitor metal lines through defect reviews.

DETAILED DESCRIPTION

Figure 1:
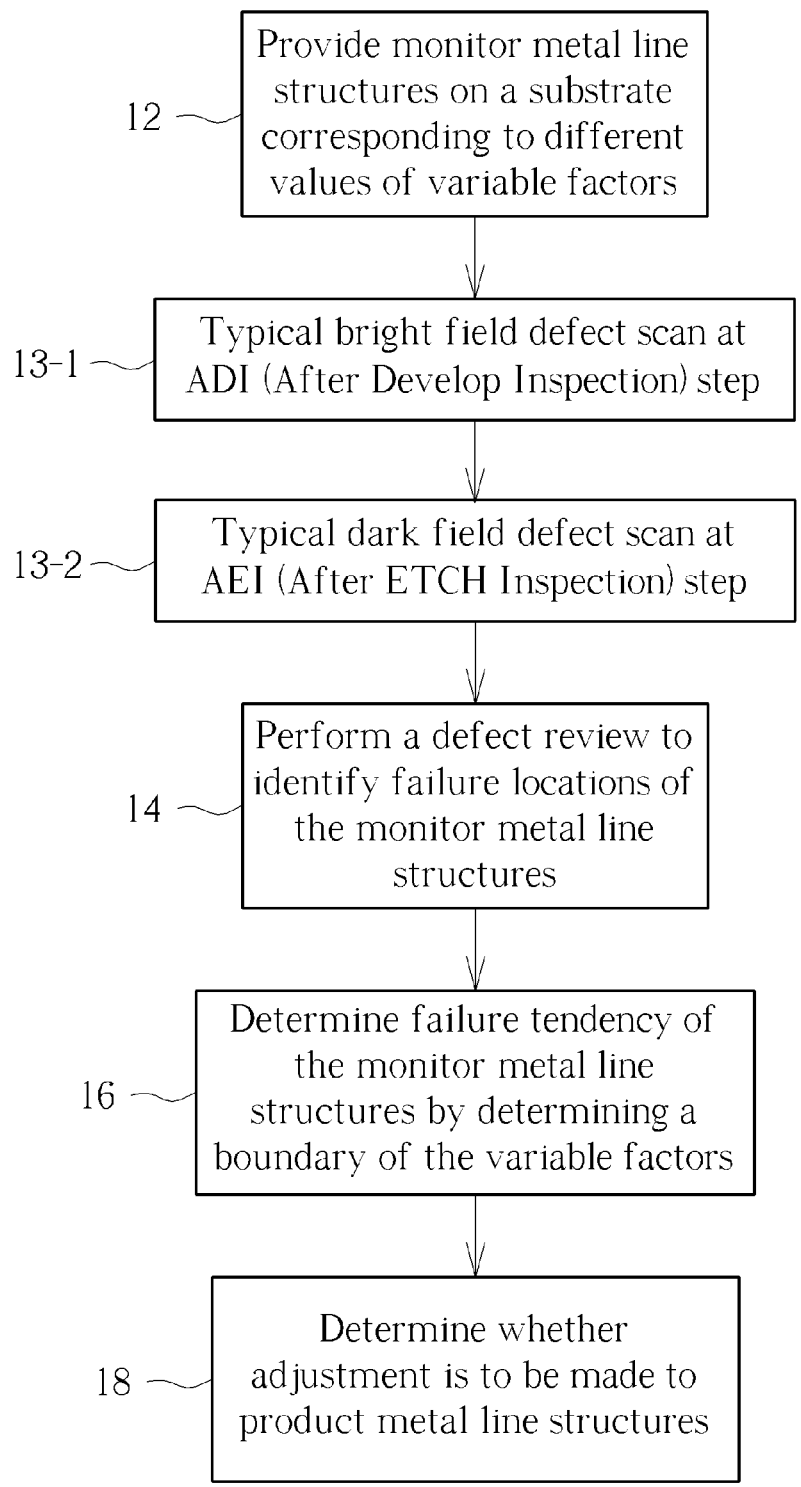
FIG. 1 is a flow chart diagram illustrating the steps for analyzing circuit pattern according to a preferred embodiment of the present invention.

Referring to FIGS. 1-2, FIG. 1 is a flow chart diagram illustrating the steps for analyzing circuit pattern according to a preferred embodiment of the present invention and FIG. 2 is a table illustrating variable factors and corresponding values that could be obtained from monitor metal lines through defect reviews. First, as shown at step 12 of FIG. 1, a plurality of monitor metal line structures are formed on discrete locations of a substrate. For instance, depending on the demand of the process, the monitor metal lines structures could be formed on a test vehicle or on scribe line regions of a product wafer, which are all within the scope of the present invention.

According to a preferred embodiment of the present invention, the monitor metal line structures include a plurality of trenches and vias, in which the trenches and vias may be formed through dual damascene processes or other semiconductor processes. For instance, trenches and vias could be formed by using at least a hard mask, such as a TiN metal hard mask 20 to carry out a series of pattern transfer and etching processes on a dielectric layer 22 such as inter-metal dielectrics (IMD) layer and/or a TEOS layer 24 situating on the substrate, and then a conductive layer including a variety of low-resistance metal materials, such as aluminum (Al), titanium (Ti), tantalum (Ta), tungsten (W), niobium (Nb), molybdenum (Mo), copper (Cu) or the likes are deposited into the trenches and vias to form the metal lines. As these processes are well known to those skilled in the art, the details of which are not discussed herein for the sake of brevity.

The plurality of monitor metal line structures preferably constitute a plurality of circuit patterns, in which the circuit patterns or the monitor metal line structures from the circuit patterns are preferably formed corresponding to different values of variable factors. The variable factors, as shown in FIG. 2, primarily include width and spacing, length of trenches, via heights, and pattern densities.

As the monitor metal line structures may be fabricated on either test vehicles or scribe line region of a product wafer, it should be noted that if the monitor metal line structures were fabricated along with product metal line structures on the same product wafer, the monitor metal line structures being fabricated preferably share identical variable factors with the product line structures. That is, if the monitor metal line structures and product metal line structures were fabricated under same processing conditions and parameters, the values of the variable factors from the two metal line structures would be substantially the same. By monitoring and reviewing changes took place in the variable factors of the monitor metal lines structures, the feasibility and necessity to adjusting the product metal lines could be evaluated thereafter.

The four categories of variable factors are discussed below. First, the width/spacing variable factor (Variable 1, V1), in which the width being the width of the metal line and spacing being the distance between the metal line, is provided in direct relation with the boundary of the technology node based on a design rule. For instance, a 65 nm technology node may be represented by a 100/100 nm width/spacing relationship, whereas a 55 nm technology node may be represented by a 90/90 nm width/spacing relationship, but not limited thereto.

According to a preferred embodiment of the present invention, the width/spacing variable factor could be examined and adjusted by two approaches. First, if the values of the width/spacing variable factor were examined under the circumstances that the values of the width/spacing is maintained at a 1:1 ratio, such as the ones shown in FIG. 2, a process window of the current technology node could be determined. For instance, the current process window of a 65 nm technology node may be represented by a 100/100 nm width/spacing, and if the values of the width/spacing variable factor were narrowed from 100/100 nm to 90/90 nm, the shrunk process window of the next generation technology node could be determined.

In addition to the above approach, another means for adjusting the width/spacing variable factor could be accomplished by maintaining the pitch of the metal line under a single technology node while adjusting either the width variable or the spacing variable individually. For instance, under a 55 nm technology node that was originally represented by a 90/90 nm width/spacing relationship, the width and line spacing variable factor could be adjusted to 110/70 nm or 100/80 nm. By doing so, the limit for adjusting the metal lines under same technology node and same pitch could be determined. In other words, in contrast to the aforementioned first approach for determining the process window under different technology node, in-line process window could be tested accordingly in the second approach.

The length variable factor (Variable 2, V2) preferably correspond to the length of the monitor metal line structures as well as the trench portion of the metal line structures, in which the range of the length variable is preferably measured between 1-100 μm based on circuit layout.

The via height variable factor (Variable 3, V3) preferably correspond to the height of the vias of the monitor metal line structures, in which the range of the via height is preferably between 750-1500 Angstroms. It should be noted that even though the via height variable factor is preferably generated by measuring the height of the via of the metal lines, the variable factor may also refer to height of the trenches in regions where no vias are present, which is also within the scope of the present invention.

In addition to width and line spacing, length of metal lines, and height of vias, the via pattern (Variable 4) of the monitor metal line structures could also be used for inspecting and reviewing the process window of the circuit pattern. Preferably, as shown in FIG. 2, the distribution of the vias is divided into three groups, including a no via region, an ISO (isolated) via region, and a dense via region. The via pattern variable factor could be evaluated with the aforementioned three variable factors at any combination, and the details of which will be discussed in the following section.

After forming the aforementioned monitor metal line structures with corresponding variable factors, at step 13-1, a typical bright field defect scan at after develop inspection (ADI) step is carried out. Preferably, variety of defects may be detected on monitor structures after develop process, in which the various types of defects may include PR peeling, PR pattern deform, bridge and residues et al.

Next, at step 13-2, a typical dark field defect scan at after etch inspection (AEI) step is performed. Preferably, defects on the monitor structures are scanned after etching process, in which defects such as metal line pattern deform or narrow, via missing, trench residue, trench bridge, or masking defects will be focused in this scan, as these defects may be originated by designated pattern.

After above scans are completed, at step 14, a defect review is performed to identify failure locations of the monitor metal line structures. The defect review could be carried by using either a high magnification optical system, a scanning electron microscope (SEM), or a system such as an electron dispersive x-ray spectroscopy (EDS) system for determining attributes of the defects such as profile, roughness, more accurate size information, as well as composition of the defects. For instance, the defect monitor metal lines obtained through the inspection and review process may be found with pattern narrow base resulting from current TiN metal hard mask process. The defects were directly correlated with the aforementioned four variable factors, in which the defect structures could also be located in dense metal regions with dense via patterns, but not limited thereto.

After the defect review is conducted and failure locations of the defects are identified, at step 16, a failure tendency of the monitor metal line structures is determined so as to determine a boundary of the variable factors. Determination of the boundary of the variable factors could be accomplished by inspecting the aforementioned four variable factors, such as by adjusting at least one of the variable factors while keeping the rest of the variable factors constant.

For instance, variables including width and line spacing, length of the monitor metal lines, and via pattern could be kept the same while the value of the via height of the monitor metal line structures is adjusted. By reviewing and examining the defect metal line structures or circuit patterns with corresponding variable factors assigned in the above fashion, for example defects were identified in patterns with via heights values above 1300 Angstroms, a boundary of that particular variable factor that is more likely to result in failure, or a tendency for such particular variable factor within a specific range or value set to result in failure could be determined accordingly.

In addition to adjusting only one of the variable factors while keeping the rest constant, it should be noted that depending on the design of the process, it would also be desirable to adjust at least two of the variable factors while keeping the rest of the variables constant or adjust at least three of the variable factors while keeping the rest constant, which are all within the scope of the present invention.

After the failure tendency of the monitor metal line structures is determined, at step 18, whether adjustment is to be made to product metal line structures could be determined accordingly. For instance, if adjustment were to be made to the product metal lines based on the monitor result, at least one of the variable factors including the aforementioned width to spacing ratio, length of the trenches, height of the vias, and via pattern of the product metal line structures could be adjusted accordingly.

Overall, the present invention provides following advantages:

1. The process window of the metal lines could be thoroughly monitored by examining and reviewing corresponding variable factors including width and line spacing, length of the metal lines, via and/or trench heights of the metal line structures, and pattern density of the line patterns. Preferably, the results of monitoring could be achieved without any process flow change being made.
2. The feasibility for shrinking current process could be assessed substantially. In other words, if the current process were to be shrunk directly, the present method could be used to estimate whether enough process window will still be kept without causing additional defects.
3. Allowing metal mask grade to be checked based on monitor result with metal critical dimension variation. For instance, lower metal mask grade typically induces greater CD variant, which further results in insufficient in-line process window. By resolving this issue, it would be desirable to define a greater metal mask grade under small scale connection so that the mask CD variant could be reduced thereby providing sufficient process window.
4. As new projects are assigned, results obtained from monitoring changes in film stack and corresponding variable factors shown in FIG. 2 could be used as a capability check for providing a new process window.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for analyzing circuit pattern, comprising:
   providing a plurality of monitor metal line structures formed on discrete locations of a substrate corresponding to different values of variable factors;
   performing a defect review to identify failure locations of the monitor metal line structures;
   determining a failure tendency of the monitor metal line structures so as to determine a boundary of the variable factors; and
   determining whether adjustment is to be made to product metal line structures.

2. The method of claim 1, wherein the substrate comprises a test vehicle or a product wafer.

3. The method of claim 1, wherein the monitor metal line structures comprise a plurality of trenches and vias.

4. The method of claim 3, further comprising adjusting at least one of the variable factors, wherein the variable factors comprise a width to spacing ratio of the trenches of the product metal lines structures, a length of the trenches of the product metal line structures, and a height of the vias of the product metal lines structures.

5. The method of claim 1, wherein the monitor metal lines share identical variable factors with the product line structures.

\* \* \* \* \*